US007807967B2

(12) United States Patent
Kim et al.

(10) Patent No.: US 7,807,967 B2
(45) Date of Patent: Oct. 5, 2010

(54) ABSORBER WITH HOLE FOR METALLIC MAGNETIC CRYOGENIC DETECTOR AND ALIGNING METHOD THEREOF

(75) Inventors: Yong Hamb Kim, Daejeon (KR); Kyoun Beom Lee, Daejeon (KR); Min Kyu Lee, Daejeon (KR); Sang Jun Lee, Seoul (KR)

(73) Assignee: Korea Research Institute of Standards and Science, Daejeon (KR)

( * ) Notice: Subject to any disclaimer, the term of this patent is extended or adjusted under 35 U.S.C. 154(b) by 169 days.

(21) Appl. No.: 12/164,735

(22) Filed: Jun. 30, 2008

(65) Prior Publication Data

US 2009/0184245 A1    Jul. 23, 2009

(30) Foreign Application Priority Data

Jan. 22, 2008    (KR)    ...................... 10-2008-0006430

(51) Int. Cl.
*G01J 1/00*    (2006.01)
(52) U.S. Cl. .................................... 250/336.1
(58) Field of Classification Search .............. 250/336.1; 374/100, 176
See application file for complete search history.

(56) References Cited

U.S. PATENT DOCUMENTS 4,396,467 A * 8/1983 Anthony ..................... 205/103
7,323,869 B1 * 1/2008 Penanen ..................... 324/248

2009/0008428 A1 * 1/2009 Kaibyshev et al. .......... 228/103
2009/0185596 A1    7/2009 Kim et al.

FOREIGN PATENT DOCUMENTS

| JP | 2004226161 A | 8/2004 |
|---|---|---|
| JP | 2004286715 A | 10/2004 |
| KR | 1020060084577 A | 7/2006 |

OTHER PUBLICATIONS

Kim et al., "Measurements and modeling of the thermal properties of a calorimeter having a sapphire absorber," 2004, Nuclear Instruments and Methods in Physics Research A, vol. 520, pp. 208-211.*
Loidl et al., "Nuclear and atomic data determination with metallic magnetic calorimeters," 2006, Nuclear Instruments and Methods in Physics Research A, vol. 559, pp. 769-771.*

* cited by examiner

*Primary Examiner*—David P Porta
*Assistant Examiner*—Kiho Kim
(74) *Attorney, Agent, or Firm*—Thomas R. FitzGerald, Esq.; Hiscock & Barclay, LLP

(57) ABSTRACT

Disclosed herein is an absorber with a hole for a metallic magnetic cryogenic detector and an aligning method. More specifically, the present invention is to provide an absorber with a small hole as an aligning mark for a temperature sensor used in a metallic magnetic cryogenic detector. A temperature sensor is bonded on the small hole of the absorber punched by a laser. Using the hole as an aligning mark the temperature sensor can be accurately positioned on the pick-up coil of the measuring means. Thus, the aligning method provides a magnetic measurement with an ideal coupling between the sensor and the pick-up loop. It eventually presents a precise measurement of the energy spectrum absorbed in a metallic magnetic cryogenic detector.

5 Claims, 2 Drawing Sheets

ABSORBER WITH HOLE FOR METALLIC MAGNETIC CRYOGENIC DETECTOR AND ALIGNING METHOD THEREOF

CROSS REFERENCE TO RELATED APPLICATIONS

This application claims priority to Korean Patent Application Number 10-2008-0006430 filed Jan. 22, 2008.

BACKGROUND OF THE INVENTION

1. Field of the Invention

The present invention relates to an absorber with a hole in a cryogenic particle detector, particularly a metallic magnetic cryogenic detector. It is to align the metallic magnetic temperature sensor relative to a pick-up loop of a measuring means. A small hole makes it possible to estimate the position of the temperature sensor on one side of the absorber from the other side. The hole is made with a high power pulse laser.

2. Background of the Related Art

A metallic magnetic cryogenic detector is one of the low temperature detectors which have demonstrated their high energy resolution. Like other low temperature detectors, it has an absorber to absorb energy of incident particles, such as x-rays, gamma rays, electrons and other particles. It also has a temperature sensor whose physical property varies with temperature. The mechanical and thermal connection between the absorber and the temperature sensor are typically made with an ultrasonic wedge-bonder. The temperature sensor is made of a material, whose magnetization keeps its paramagnetic property even at very low temperatures below 100 mK. The change of the magnetization due to the absorption of the incident energy is magnetically measured with a pick-up loop wound around the temperature sensor. The measuring means can be a superconducting quantum interference device (SQUID) or a superconducting planar coil connected to another SQUID.

When energy of a particle to be detected is absorbed in the absorber of the metallic magnetic cryogenic detector, the temperature of the absorber varies according to the deposited energy. The SQUID measures a magnetic flux variation caused by the temperature variation to obtain the deposited energy.

In order to precisely measure a temperature variation, it is required to locate the temperature sensor inside a pick-up coil of the SQUID. In the process of attaching the temperature sensor to the absorber having a thickness of 1 through 5 $\mu$m, a pressed mark is formed on the backside of the absorber. The pressed mark is used for aligning the temperature sensor relative to the pick-up loop coil. However, the pressed mark is not often distinct. Thus, it requires an extreme caution for accuracy when aligning the temperature sensor relative to the pick-up coil because of the limited estimation of the sensor position.

Furthermore, when a absorber thicker than 10 $\mu$m is used, the pressed mark is barely noticeable. It makes it difficult to align the temperature sensor with the pick-up loop coil.

SUMMARY OF THE INVENTION

Accordingly, the present invention has been made in view of the above-mentioned problems occurring in the prior art. A primary object of the present invention is to provide a small hole in an absorber as an aligning mark for a temperature sensor used in a metallic magnetic cryogenic detector. A temperature sensor is bonded on the small hole of the absorber punched by a laser. The dimension of the hole is smaller than the size of the sensor. Using the hole as an aligning mark the temperature sensor can be accurately positioned on the pick-up coil of the measuring means. Thus, the aligning method provides a magnetic measurement with an ideal coupling between the sensor and the pick-up loop. It eventually presents a precise measurement of the energy spectrum absorbed in a metallic magnetic cryogenic detector.

In order to accomplish the above object of the present invention, a hole is created in the absorber by a high power pulse laser.

The absorber may be a metallic absorber.

Preferably, the absorber may be made of gold.

The absorber may have a thickness ranging from 5 to 100 $\mu$m.

The absorber may be a single layered foil.

The absorber may be formed of double layers diffusion-welded by simultaneous heating and pressing.

The hole may have a diameter ranging from 8 to 30 $\mu$m.

The magnetic flux detecting means may be a superconducting quantum interference device (SQUID).

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1A:
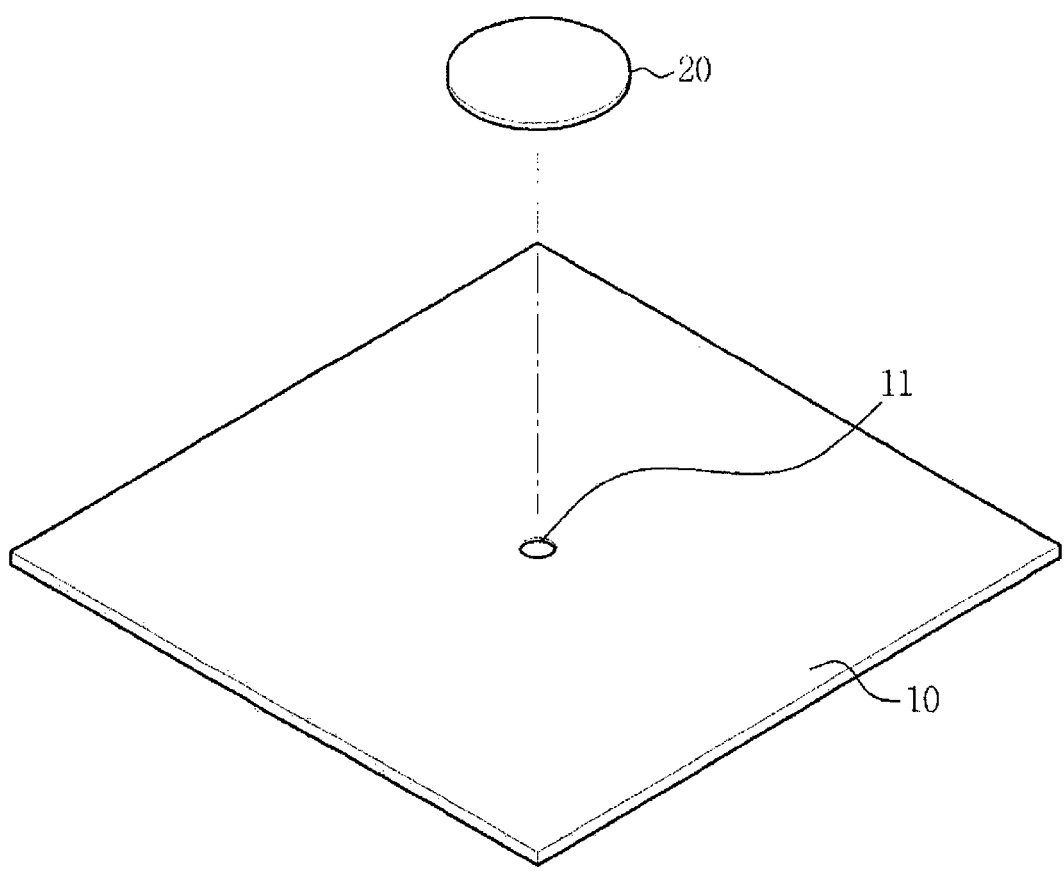
FIG. 1a is a perspective view illustrating the alignment of a temperature sensor with an absorber in order to attach the temperature sensor to the absorber according to the present invention.

Hereinafter, the present invention will be described in detail with reference to the appended drawings. In the appended drawings, reference numeral 10 denotes an absorber and 20 denotes a temperature sensor.

The present invention relates to an absorber 10 of a metallic magnetic cryogenic detector for absorbing energy in the absorber 10. The present invention forms a hole 11 in the absorber 10 to achieve an accurate position alignment of the temperature sensor 20 and magnetic flux detecting means 30 of the metallic magnetic cryogenic detector.

The absorber 10 can be a single-layered structure or a double-layered structure. Although any material can be used for an absorber, gold is preferable for its good thermal conductivity and high stopping power.

The absorber 10 has a thickness ranging from 5 to 100 $\mu$m.

The hole 11 is punched by a high-power pulse laser. In a preferred embodiment of the present invention, the hole 11 has a diameter ranging from 8 to 30 $\mu$m. Namely, it should be as large as 8 $\mu$m at least to make it noticeable, but not bigger than the temperature sensor 20, a disk with 50 $\mu$m diameter typically.

Figure 1B:
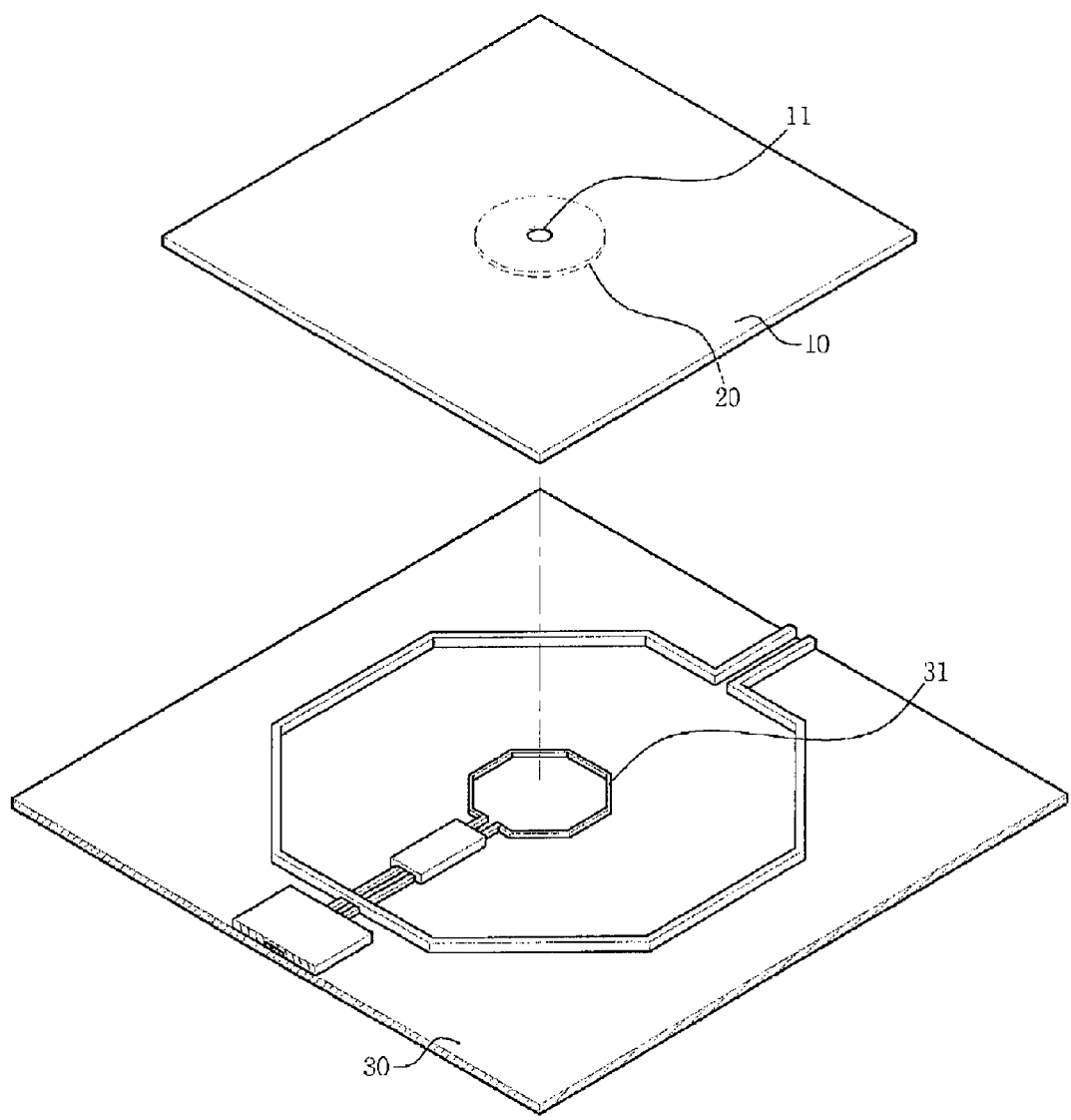
FIG. 1b is a perspective view illustrating the alignment of the temperature sensor attached to the absorber with a pick-up coil according to the present invention.

A method of aligning the absorber with a hole for a metallic magnetic cryogenic detector according to the present invention will be described with reference to the appended drawings. FIG. 1a is a perspective view illustrating the alignment of a temperature sensor with an absorber in order to attach the temperature sensor to the absorber according to the present invention. FIG. 1b is a perspective view illustrating the alignment of the temperature sensor attached to the absorber with a pick-up coil according to the present invention.

Referring to FIG. 1a, the temperature sensor 20 is placed on the absorber 10. Specifically, the temperature sensor is ultrasonically bonded on the hole 11 of the absorber 10 using a wedge bonder.

Referring to FIG. 1b, the absorber 10 having the temperature sensor 20 attached thereto is located on the magnetic flux detecting means 30. Specifically, the absorber 10 is turned upside down so that the temperature sensor 10 is located beneath the absorber 10. This work is performed under a long focal length microscope with a real-time computer imaging feature. The microscope is focused on the pick-up coil 31. The measuring means 30 is fixed relative to the microscope to let the absorber assembly be the only moving part. The position of the absorber, then, is adjusted in order to align the center of the hole 11 with the center of the pick-up coil 31 on the computer image.

Subsequently, the absorber 10 with the temperature sensor 11 and the magnetic flux detecting means 30 with the pick-up coil 31 are assembled to provide an ideal magnetic coupling. Here, the temperature sensor 20 is attached to the magnetic flux detecting means 30 in alignment with the center of the pick-up loop coil 31.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An absorber (10) for a metallic magnetic cryogenic detector comprising a temperature sensor (20) wedge-bonded to the absorber (10) for measuring temperature change of the absorber (10), wherein the absorber (10) is made of a metal with a thickness ranging from 5 to 100 μm for absorbing and further comprising a hole (11) is formed using a high-power pulse laser at the center of the absorber, said hole having a diameter ranging from 8 to 30 μm and smaller than the size of the temperature sensor (20).

2. The absorber for a metallic magnetic cryogenic detector according to claim 1, wherein the absorber (10) is a single-layer.

3. The absorber for a metallic magnetic cryogenic detector according to claim 1, wherein the absorber (10) is formed of double layers which are diffusion-welded by simultaneous heating and pressing.

4. A method of aligning an absorber having a hole for a metallic magnetic cryogenic detector, the aligning method comprising: aligning the center of a temperature sensor (20) with the center of the hole (11), said hole having a diameter ranging from 8 to 30 μm, of an absorber (10) and mounting the temperature sensor (20) on the absorber (10); disposing the absorber (10) with the temperature sensor (20) downward on a magnetic flux detecting means (30); and mounting the temperature sensor (20) on a pick-up loop coil of the magnetic flux detecting means (30) such that the center of the hole (11) is aligned with the center of the pick-up loop coil.

5. The aligning method according to claim 4, wherein the magnetic flux detecting means (30) is a superconducting quantum interference device (SQUID).

* * * * *